United States Patent [19]

Su et al.

[11] 4,313,127
[45] Jan. 26, 1982

[54] SIGNAL DETECTION METHOD FOR IR DETECTOR HAVING CHARGE READOUT STRUCTURE

[75] Inventors: Stephen C. Su, San Clemente; Ronald M. Finnila, Carlsbad, both of Calif.

[73] Assignee: Hughes Aircraft Company, Culver City, Calif.

[21] Appl. No.: 127,678

[22] Filed: Mar. 6, 1980

[51] Int. Cl.³ .............................................. H01L 27/14
[52] U.S. Cl. .......................................... 357/30; 357/24
[58] Field of Search .................................... 357/30, 24

[56] References Cited

U.S. PATENT DOCUMENTS

| 4,190,851 | 2/1980 | Finnila | 357/30 |
|---|---|---|---|
| 4,198,646 | 4/1980 | Alexander | 357/30 |
| 4,213,137 | 7/1980 | Pines | 357/30 |

Primary Examiner—Martin H. Edlow
Attorney, Agent, or Firm—W. H. MacAllister; J. E. Szabo; G. B. Rosenberg

[57] ABSTRACT

A method and apparatus for improving the operation of infrared detectors of a type generally characterized by a semiconductive substrate of a first conductivity type which includes a detection region defined or bounded by a heavily doped backside electrode and buried layer of the first conductivity type. A charge coupled device (CCD) readout structure for transfers charge in an epitaxial layer of second conductivity type which overlies the substrate, and the detector further includes a heavily doped layer of the second conductivity type positioned between the epitaxial layer and the substrate to shield the charge carriers of the substrate from the CCD voltages. Means are provided by the present invention for the injection of minority charge carriers into the epitaxial region which are subsequently transferred to output means by the CCD. The substrate is biased so that a portion of the flow of minority carriers in the epitaxial layer will be diverted toward the backside electrode when the detection region is raised to conduction by the incidence of photon energy so that a subtractive indication of the radiation is obtained while harmful double injection and attendant substrate breakdown are avoided.

9 Claims, 1 Drawing Figure

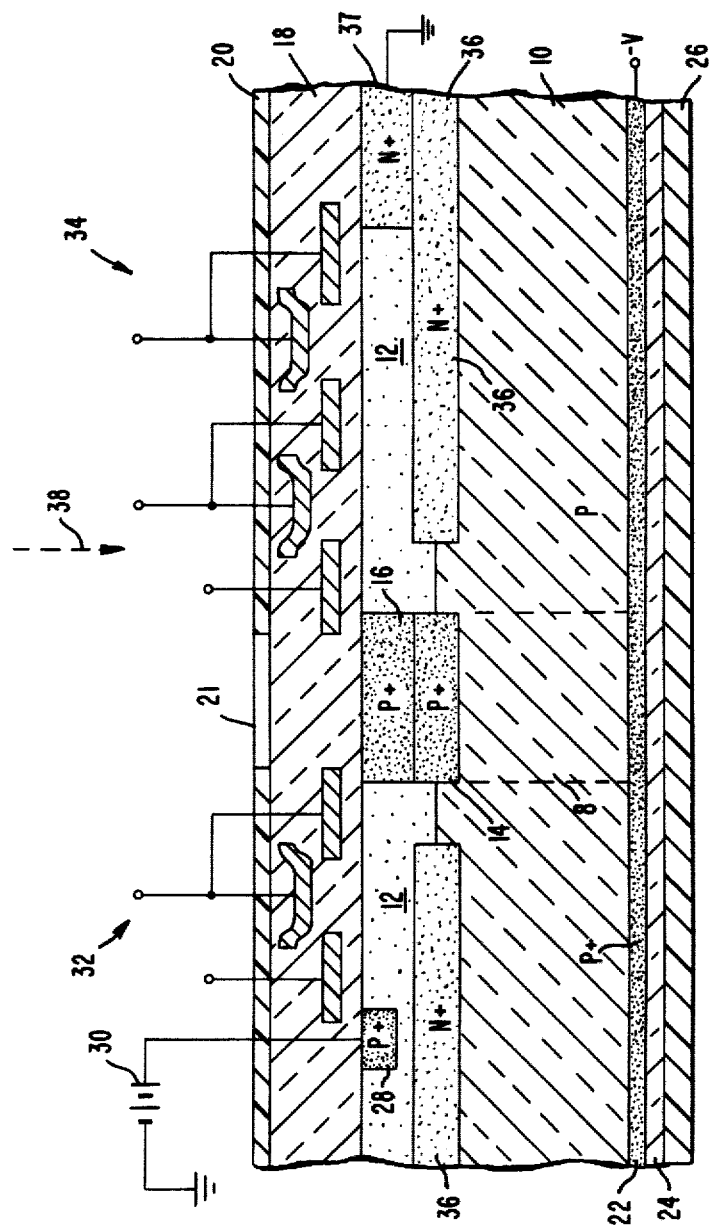

SIGNAL DETECTION METHOD FOR IR DETECTOR HAVING CHARGE READOUT STRUCTURE

TECHNICAL FIELD

The present invention relates to means and methods for detecting infrared radiation and, more particularly, to methods for operating an IR detector of the type that includes a semiconductive substrate which underlies a layer wherein there is formed a charge coupled device (CCD) readout structure.

BACKGROUND ART

A number of very useful infrared detectors have been developed which feature an extrinsic semiconductive substrate, a portion of which serves as a detector element, coupled to a charge readout structure located in an overlying layer. Devices of this nature are illustrated and described, inter alia, in a co-pending U.S. patent application (Ser. No. 614,277) and a U.S. Pat. No. 4,142,198 ("Monolithic Extrinsic Silicon Infrared Detectors with an Improved Charge Collection Structure") of the Applicants herein. Both of the aforementioned are the property of the present assignee. The above-referenced patent, which discloses an improved planar geometry with respect to the pending (and presently allowed) application, features a semiconductor substrate of a first conductivity type having an overlying, continuous epitaxial layer for the transfer of charge to a utilization circuit by means of a CCD structure located in an overlying insulating layer of SiO$_2$ or the like. An aperture in a radiation absorptive covering layer positions and defines the individual detector within the underlying substrate. Charge is transferred from the detector element of the substrate to the epitaxial layer by, inter alia, a heavily doped buried layer of the first conductivity type disposed adjacent a portion of the interface between the substrate and the epitaxial layer and a heavily doped surface layer of the first type of conductivity formed in the epitaxial layer adjacent and overlying the substrate in the detector area. These combined, heavily doped layers, in conjunction with a heavily doped backside layer, serve as electrodes for the application of a photon-generated, carrier-depleting electric field across the substrate. The lightly doped substrate is maintained at an electrically insulative temperature (below 40° Kelvin) so that the absorption of photon energy is required to raise the energy band of the majority carriers of the substrate to conduction. Absent the absorption of such energy, these carriers are immobile or "frozen out", resulting in a state of electrical insulation.

An important feature of the patented device is the provision of a heavily doped buried layer of the second conductivity type adjacent the interface of the substrate and epitaxial layer and spaced from the aforementioned buried layer of opposite conductivity type. This buried layer serves the vital function of insulating the substrate from the overlying CCD structure. As the CCD must accomplish charge transfer by the creation of potential wells attractive to the majority carriers of the substrate (minority carriers of the epitaxial layer), the absence of such a doped buried layer (which provides a re-combination site for carriers within the substrate) would introduce a certain amount of noise into the output of the device and would additionally prevent the room temperature testing of CCD devices even in a thin (3-4 micrometer) epitaxial layer.

The aforementioned device, and other devices similar in principle, are conventionally operated in two separate steps. First, the mobile carriers of the substrate, energized or "unfrozen" by absorbed radiation, are "pushed" into the charge transfer circuitry by the aforementioned electric field applied across the backside and collection electrodes. If, for example, the substrate is doped with the atoms of a Group 3 element such as gallium or indium, standard procedures would involve the application of a higher potential to the backside electrode than to the collector electrode to inject the generated mobile carriers into the charge transfer structure. The second step involves the CCD transfer of the generated mobile carriers within the epitaxial layer (in which these are now minority carriers) to the utilization circuitry.

The inventors herein have found that, operated in accordance with the above-described conventional mode, useful radiation detection may be achieved with such devices. However, device performance has been found to be seriously flawed for certain applications by the presence of undesired noise and high operating temperatures. This noise and heat are believed by the inventors herein to result from the device's P-I-N structure occasioned by the above-described geometry which incorporates interfacing layers (isolation layer, substrate (insulative at low temperatures) and backside electrode) "sandwiched" together forming a combination which is necessarily forward biased in the conventional charge collection mode. The forward biasing of this combination leads to the "double injection" of carriers into the substrate. That is, the forward bias condition results in a flow of substrate current composed, in part, of the transfer of both holes from the backside electrode and electrons from the isolation layer into the substrate. As a result, considerable current passes through the substrate. (It has been found that, under certain substrate doping conditions such as heavy gallium doping, a forward bias of 5 volts or greater can, in fact, drive a substrate to avalanche breakdown.) While a certain amount of (leakage) current is tolerable, the avalanche phenomenon, effectively creating a short circuit through the substrate, is a major hindrance to the perfection of the operation of a device of the type described. The breakdown problem may be moderated by the use of high-breakdown dopants, such as indium which has a breakdown of over 40 volts. However, gallium is particularly desirable for infrared detection. While indium and gallium both function well in the 3 to 5 micron range, (radiation penetration of clouds, etc.), indium is not an effective detector material in the other significant IR "window" existing at 8 to 12 microns. This window, which includes night vision, is critical to most tactical applications and, thus, gallium doping is essential for the reliable operation of long wavelength systems.

SUMMARY OF THE INVENTION

It is therefore an object of the present invention to devise a method and associated means for operating a detector of the type disclosed generally hereinabove so that the device is unhindered by shorting due to the occurrence of avalanche breakdown across the detector substrate.

It is a further object of the present invention to achieve high responsivity in the detection of infrared radiation by means of an IR detector as described above.

It is yet another object of the present invention to achieve a low noise, low temperature method for utilizing a detector as generally described herein.

It is yet still a further object of the present invention to devise a method and associated means to operate a detector of the type herein described whereby undesirable subthreshold MOSFET operation is avoided.

These and other objects are achieved by the present invention which provides a method and associated means for measuring the energy absorbed by a detector generally configured as described above. Unlike the detectors and operating methods presently employed, the detector of the present invention is biased so that the buried shield layer to backside electrode PIN "sandwich" is back-biased to avoid the above-described avalanche phenomenon occasioned by double injection into the substrate.

A subtractive method is employed in conjunction with the reverse bias to give an indication to the detector's associated utilization circuitry of the magnitude of the charge carriers energized by the incident radiation. A steady flow of carriers of the first conductivity type, continuously injected into the epitaxial layer, passes above the detector region of the substrate, and is subsequently clocked through the CCD to utilization circuitry which interprets the "full" flow of charge of the first conductivity type as an indication of no detected radiation. Incident radiation results in a proportionate increase in the conductivity of the detector region of the substrate. This increased conductivity provides a path from the epitaxial layer to the backside electrode, a path which, in conjunction with the reverse biasing of the substrate, serves to draw toward the backside electrode a portion of the charge carriers which would otherwise flow along the CCD apparatus to the output utilization circuitry. In this manner charge, proportional to the intensity of the incident radiation, is diverted from the utilization circuitry where the diversion serves as a (subtractive) indication of the detected radiation's intensity.

BRIEF DESCRIPTION OF THE DRAWING

The single drawing is a sectional view of a detector according to the present invention.

DETAILED DESCRIPTION OF THE INVENTION

The structure, operation and method of the present invention will now be described with reference to the detector illustrated in FIG. 1. The method disclosed herein, it will be appreciated, may be practiced successfully by means of a number of similar structures. Minor (nonfunctional) variants of the device illustrated in FIG. 1, it will be seen, present like problems and are amenable to the solution proposed herein. For instance, both "P-type" and "N-type" image detectors, generally constructed according to FIG. 1, can be operated advantageously according to the method disclosed. While the detailed discussion which follows discloses and focuses upon a detector having a P-type substrate, an N-type epitaxial layer and a P+ buried layer, the same operating principles apply to an "N-type" detector having an N-type substrate, a P-type epitaxial layer, an N+ buried layer, an N+ surface layer, an N-channel CCD and a P+ shield layer. An appropriate dopant for the substrate of the "N-type" detector is arsenic. The selection of the optimal substrate dopant is dependent upon intended detector use. For example, indium or gallium are appropriate P-type dopants for the infrared range of 3 to 5 micrometers while gallium possesses additional detection utility in the range of 8-14 micro-meters. The significance of such ranges has been discussed above.

Referring now to FIG. 1, there is shown a cross sectional view of a "P-type" infrared detector according to the present invention. A plurality of detector elements, such as the single detector element 8, is formed in a semiconductor substrate 10 and extends therethrough. In an exemplary device the substrate 10 was extrinsic silicon doped with gallium atoms to a concentration of approximately $3 \times 10^{16}$ atoms per $cm^3$. An epitaxial layer 12 of N-type silicon is formed on the substrate 10. The layer 12 is invisible to infrared radiation, thus allowing its passage therethrough to reach the detector element 8. The epitaxial layer 12 is preferably doped with phosphorus or like dopant to prevent carrier freeze-out, the immobilization of carrier atoms due to the cooling of the substrate, at operating temperatures. On a portion of the epitaxial layer-substrate interface in the vicinity of the detector element 8 there is a P+ buried layer 14. This layer is usually formed prior to the deposition of the epitaxial layer 12 and may be made by doping a portion of the substrate 10 over the detector element 8 with a P-type impurity, such as, for example, boron. The P+ type layer 14 should be degeneratively doped with a typical concentration of over $5 \times 10^{18}$ atoms/$cm^3$, so that carriers will not freeze out completely at the device operating temperature, and, yet, it should not be so heavily doped as to hinder the later epitaxial deposition operation. This P+ buried layer 14 will outdiffuse into the epitaxial layer 12 during subsequent processing steps. A P+ surface layer 16 is formed in electrical connection to the P+ buried layer at zero bias voltage. Above the epitaxial layer 12 there is a layer 18 of insulating material in which CCD capacitors are located. On top of this insulative layer there is a radiation shield 20. The radiation shield has an aperature 21 in the area above the detector element to permit radiation to reach the detector after penetrating through the dielectric layer, the surface layer, and the buried layer. The radiation shield 20 can be made from an aluminum layer, but, in order to minimize optical cross-talk due to reflections between the radiation shield and optical components, an absorbing material such as polyimide varnish is preferred.

Optical cross-talk due to reflection off the back surface of the substrate 10 also poses a potential problem. To counter this, an optical absorbing layer 26 is superimposed over an optical coupling layer 24, which, in turn, is superimposed on a P+ diffused layer 22 formed on the backside of the substrate 10. The layer 22 is also referred to as the detector electrode and is connected to a source of negative voltage, −V.

The epitaxial layer 12 is connected to ground and/or a more positive potential than the layer 22, according to the method of the present invention. The biasing achieved thereby forms a critical step of the operational method of the present invention and is to be contrasted with the prior art method of operation of a "P-type" detector wherein the layer 22 and/or its equivalent is normally connected to a source of positive voltage (relative to the epitaxial layer 12).

A P+ diffusion 28 within the N-type epitaxial layer is connected to a source of positive voltage 30. The diffusion 28, which may be formed by degenerative doping and/or ion implantation, serves as a source of the holes essential for subtractive readout according to the present invention. It will be seen that the diffusion 28 might, alternatively, be doped N+ to serve as a source of mobile electrons within a P-type epitaxial layer.

A plurality of CCD electrodes is disposed in the insulating layer 18. The electrodes, which may comprise a structure with overlapping polycrystalline silicon gate electrodes defining, for instance, a two-phase system, may be grouped into a charge injection group 32 and a charge readout group 34.

The fields generated by the drive voltages applied to those electrodes cooperate with the epitaxial layer 12 to define the functioning of the charge coupled device readout circuitry. A secondary layer 36 shields both CCD groups 32, 34 from the substrate 10. For the P-channel CCD of the devices 32, 34 of FIG. 1, the shield layer 36 is doped N+ and underlies the aforementioned CCD structures. An N+ surface layer 37, in contact therewith, serves as both a channel stop and as an ohmic contact for application of an electrical potential to the epitaxial layer 12. Leakage current within the substrate 10 attracted by the potential wells generated by the necessarily negative CCD drive voltages applied above the shield layer 36 is thereby recombined in the shield layer 36, reducing the system noise and enabling the room temperature testing of CCD devices even on a thin (i.e. 3-4 micrometer) epitaxial layer.

A linear array of photodetector elements as described is generally used either with an optical scanner or moved in an alternative conventional manner relative to the scene to be imaged. From each photodetector element 8, a charge transfer path leads orthogonally away from the row of photodetectors to a CCD shift register at the rear of the device extending in a direction parallel to the row of photodetectors for final readout. Charge read into the CCD shift register in parallel is read out serially. The details of circuit configuration and the mode of operation of the signal readout function, including the operation of the bias electrode, transfer gate 40 and the CCD shift register, have been more fully set forth and explained in the copending application Ser. No. 614,277, filed Aug. 17, 1975, of the inventors. This application is the property of the assignees herein and currently stands allowed. The device claimed in this application uses, like the present invention, a CCD circuit for the processing of the readout signal.

In operation, the diffusion 28 provides a constant supply of holes which are advanced by the charge injection group 32 of CCD electrodes, the surface layer 16 and the charge readout group 34 of electrodes to utilization circuitry (not shown). The amount of charge injected from the diffusion 28 may be controlled so that, in conjunction with the drive voltages applied to the charge injection group 32 and to the charge readout group 34, a relatively "full well" condition is obtained. That is, the drive voltage e.m.f. is exhausted by the attraction of the quantity of holes in the associated electric field. Such a condition assures that the CCD will operate in its linear region as opposed to the subthreshold region in which the transconductances of the MOSFETS of the CCD structures are relatively low. Such operation is advantageous in terms of detector readout sensitivity and most critical in CCD uses which employ many gates. Thus, absent radiation, the device of FIG. 1 produces a steady readout of charge.

IR energy 38 incident upon the device of FIG. 1 enters the N-type substrate 10 at the aperture 21. This radiation is absorbed by the formerly frozen out holes (that is, immobile) of the substrate 10, raising the energy of the detector region 8 to conduction. Thus, the charge advancing from the diffusion 28 through the charge injection CCD 32 no longer sees the substrate 10 as an insulator. Rather, the portion of the substrate 10 underlying the buried layer 14 has a finite conductivity due to the energization of the holes in the detector region 8. The IR responsivity of the substrate 10 material assures that the increase in conductivity is a function of the amount of IR which has fallen upon the formerly frozen out (immobile) holes of the detector region 8. After the absorption of energy, therefore, the holes injected at the diffusion 28 branch along two conductive paths, one path including the charge readout CCD group 34 and the other including the detector region 8 of the substrate 10, rather than flowing solely through the CCD readout group 34. The biasing of the backside electrode 22 negative with respect to the epitaxial layer 12 assures the flow of a portion of the injected holes in the direction of the backside of the substrate. The "diversion" of these holes is reflected in the amount of charge delivered by the CCD charge readout group 34 to associated utilization circuitry (not shown). The diminution of the output signal thereby provides a direct indication of the amount of radiation incident upon the device.

The biasing of the backside electrode 22 with respect to the epitaxial layer 12 not only serves to divert the injected holes through the substrate 10, allowing the subtractive charge readout of the present invention, but also serves to back-bias the PIN diode formed by the combination of the back electrode 22, substrate 10 (holes not exposed to radiation maintain the insulative character of such positions of the substrate 10 removed from the detector region 8) and the shield layer 36. By back-biasing this PIN diode, the double injection problem (injection of holes from the back electrode 22 and electrons from the shield layer 36 to provide avalanche current through the substrate 10) is avoided.

Thus, it is seen that there has been brought to the detector art a new and improved extrinsic detector and means for operating same in which the operational problems associated with double injection are avoided. A detector of the type described herein operated according to the methods disclosed thus is protected from the substrate breakdown, excessive noise and high operating temperatures formerly encountered by means and methods generally employed for operation of similar detectors. The use of a subtractive readout mode additionally allows one to operate the detector efficiently and effectively by utilizing the favorable linear region of the individual MOSFETS which make up the CCD's of the present invention.

While the invention has been described in connection with a preferred embodiment, it will be understood that it is not limited to the particular embodiment as depicted in the drawing. On the contrary, it is intended to cover all alternatives, modifications and equivalents as may be included within the spirit and scope of the invention and as described in the appended claims.

What is claimed is:

1. A method for operating a radiation detector of the type that includes a semiconductive substrate of a first conductivity type having an upper surface and a lower surface, a heavily doped region of said first conductivity type adjacent a portion of said upper surface defining a charge collection electrode and a heavily doped region of said first conductivity type adjacent said lower surface defining a backside electrode whereby there is formed a detection region within said substrate, said detector additionally including a heavily doped region of a second conductivity type and adjacent another portion of said upper surface of said substrate, said method comprising the steps of:
- (a) providing an excess of mobile charge carriers of the first conductivity type in said region defining a charge collection electrode;
- (b) maintaining the upper surface of said substrate at such a potential with respect to the lower surface of said substrate that the resultant electric field within said substrate when said detection region has been raised to conduction by incident radiation will cause a net flow of mobile charge carriers of the first type from the upper surface of the substrate to the lower surface thereof; and
- (c) measuring the diminution of the mobile charge carriers of the first conductivity type in said region defining a charge collection electrode due to the flow of a portion of said mobile charge carriers into said detection region, thereby providing an indication of the amount of radiation incident upon said detector.

2. A method as defined in claim 1 additionally characterized by the steps of:
- (a) injecting charge carriers of the first conductivity type into the detector;
- (b) then advancing said carriers through a region adjacent the upper surface of the substrate including the area above the detection region of said substrate whereby a number of said charge carriers are caused to flow to the lower surface of said substrate when said detection region has been raised to conduction by incident radiation; and
- (c) measuring the number of said charge carriers in the region adjacent the upper surface of the substrate after said carriers have been advanced through said region including the area above the detection region of said substrate.

3. In a detector of the type that includes a semiconductive substrate of a first conductivity type having an upper surface and a lower surface, a heavily doped region of said first conductivity type adjacent a portion of said upper surface defining a charge collection electrode and a heavily doped region of said first conductivity type adjacent said lower surface defining a backside electrode whereby there is formed a detection region within said substrate, and said detector additionally including a heavily doped region of a second conductivity type adjacent said upper surface of said substrate, the improvement comprising:
- (a) means for advancing charge carriers of the first conductivity type into said region defining a charge collection electrode; and
- (b) means for diverting the flow of said charge carriers from said region defining a charge collection electrode through said detection region to the lower surface of said substrate in proportion to the amount of radiation incident upon said detector.

4. A detector as defined in claim 3 wherein said means for advancing charge carriers comprises:
- (a) a source of charge carriers of said first conductivity type, said source being located in said region of a second conductivity type adjacent said upper surface of said substrate; and
- (b) means for directing the advance of charge carriers through said region defining a charge collection electrode.

5. A detector as defined in claim 4 further characterized in that said source of charge carriers additionally includes:
- (a) a highly doped region of said first conductivity type in said region of a second conductivity type adjacent said upper surface of said substrate; and
- (b) means for applying a bias voltage to said highly doped region so that said charge carriers are advanced from said highly doped region into said region of a second conductivity type adjacent said upper surface of said substrate.

6. A detector as defined in claim 4 further characterized in that said means for directing the advance of charge carriers additionally comprises:
- (a) first means for transferring charge from said source of charge carriers to the region above the detection region of said substrate; and
- (b) a second means for transferring said charge from the region above the detection region of said substrate to a utilization circuit.

7. A detector as defined in claim 6 further characterized in that each of said first means and said second means comprises a charge coupled device.

8. A radiation detector of the semiconductor materials variety comprising:
- (a) a P-type substrate having an upper surface and a lower surface;
- (b) a first P+ region adjacent a portion of said upper surface defining a charge collection electrode;
- (c) a second P+ region adjacent said lower surface defining a backside electrode whereby there is defined a detection region of said substrate which interlies said electrodes;
- (d) an N-type epitaxial region having an upper surface and a lower surface, the lower surface of said N-type region adjacent the upper surface of said substrate;
- (e) an N+ region adjacent portions of the lower surface of said epitaxial region and the upper surface of said substrate;
- (f) a charge coupled device structure overlying said epitaxial region for transferring charge carriers through said epitaxial region; and
- (g) a P+ region in said epitaxial region to provide a source of minority charge carriers.

9. A radiation detector of the semiconductor materials variety comprising:
- (a) a p-type semiconductor substrate having an upper surface and a lower surface;
- (b) a first p+ region adjacent a portion of said upper surface, said first p+ region forming a charge collection electrode overlying a radiation detector region within the bulk of said substrate;
- (c) a second p+ region adjacent said lower surface, said second p+ region forming a backside detector electrode, said detector region lying between said electrodes;
- (d) an n-type epitaxial semiconductor region having an upper surface and a lower surface, said epitaxial region forming a layer that overlies the remaining portion of the upper surface of said subatrate and thereby surrounds said charge collection electrode;
- (e) an n+ region forming a charge coupled device shield layer lying between said epitaxial layer and said substrate and having a window therein, said charge collection electrode being located within said window and spaced apart from said shield layer;

(f) a third p+ region located within and at the upper surface of said epitaxial layer to provide a source of minority charge carriers;

(g) a charge coupled device structure including a charge injection group and a charge readout group formed in a dielectric layer overlying said epitaxial region for advancing charge carriers from said third p+ region through said epitaxial region and into said charge collection electrode by said charge injection group and from said charge collection electrode through said epitaxial layer to a utilization circuit by said charge readout group; and (h) a radiation shield layer overlying said dielectric layer and said charge coupled device structure contained formed therein, said shield layer having a detection aperture exposing a portion of said dielectric layer symmetrically overlying a portion of said charge collection electrode, thereby allowing incident radiation to reach the detector region after penetrating through the exposed portion of the said dielectric layer and the underlying portion of the said charge collection electrode.

* * * * *